United States Patent [19]

Lewis

[11] Patent Number: 5,045,811

[45] Date of Patent: Sep. 3, 1991

[54] TUNED RING OSCILLATOR

[75] Inventor: David M. Lewis, Santa Cruz, Calif.

[73] Assignee: Seagate Technology, Inc., Scotts Valley, Calif.

[21] Appl. No.: 474,183

[22] Filed: Feb. 2, 1990

[51] Int. Cl.$^5$ .............................................. H03B 5/00
[52] U.S. Cl. ..................................... 331/1 A; 331/17; 331/2 J; 331/57; 331/DIG. 3
[58] Field of Search ...................... 331/1 A, 17, 25, 57, 331/DIG. 3

[56] References Cited

U.S. PATENT DOCUMENTS 4,494,021  1/1985  Bell et al. ......................... 331/25 X
4,902,986  2/1990  Lesmeister ........................... 331/25

OTHER PUBLICATIONS

Mead et al., *Introduction To VLSI Systems*, Addison-Wesley, Reading Massachusetts, Oct. 1980, pp. 233–236.

*Primary Examiner*—Siegfried H. Grimm
*Attorney, Agent, or Firm*—Flehr, Hohbach, Test, Albritton & Herbert

[57] ABSTRACT

An oscillator circuit is tuned to the frequency of reference pulses, for example, the spindle index pulses of a rotating magnetic storage system. A ring oscillator circuit includes a series transmission gate. The transmission gate is controlled by the output signal from a programmable delay line to interrupt operation of the ring oscillator and, in effect, provide fine tuning of the ring oscillator frequency in programmed steps. The output signal of the ring oscillator is divided down in a programmable divider, which provides a coarse frequency adjustment for an output pulse signal provided by the divider. Output signals from the divider are also provided as inputs to the programmable delay line. The frequency of the output pulse signal is compared to the frequency of the reference pulses to generate control signals for the programmable delay line. The control signals are generated by a microprocessor.

8 Claims, 3 Drawing Sheets

EXAMPLE CLOCK GENERATOR CIRCUIT

EXAMPLE CLOCK GENERATOR CIRCUIT

SHORT CLOCK EXTENSION

LONG CLOCK EXTENSION

TUNED RING OSCILLATOR

BACKGROUND OF THE INVENTION

1. Field of the Invention

This invention relates to clock generators for digital electronic circuits and, more particularly, to apparatus and a method for generating a clock signal which is tuned to a reference frequency.

2. Prior Art

The subject of clock generation for digital electronic circuits is covered in section 7.4 "Clock Generation" of a book by Carver Mead and Lynn Conway entitled *Introduction to VLSI Systems,* Addison-Wesley, October 1980, pages 233–236. Previously, the reference clock for operation of subsystems was obtained from a master clock signal, obtained from a crystal or other resonant circuit. For a self-contained VLSI system on an integrated circuit chip, it is often essential that clock signals be generated on the chip. The book recommends that, instead of dealing with electronic oscillator circuits, it is better to take a more basic approach beginning with an understanding of what clock signals are used for. A fundamental principle is stated, which is that the role of the clock in a synchronous system is to connect a sequence of desired events with time. The interval between clock transitions must be sufficient to permit the activities planned for that interval to occur. A clock signal then is more like a set of timers than an oscillator.

Timers can be built as a chain of inverter circuits. Clock generation circuits that use timers are elaborations on a ring oscillator circuit, which has an odd number of signal inversions around the ring. The ring oscillator has a period that is an odd sub-multiple of the delay time twice around the ring. To avoid having the ring oscillate at a harmonic, clock signals are suppressed during initialization by using a gate in series with the ring to inhibit operation until an initializing signal is provided.

SUMMARY OF THE INVENTION

It is an object of the invention to provide a time reference signal which is tuned to a variable system reference signal, such as the spindle index pulse of a magnetic disc drive.

In accordance with this and other objects of the invention, a tuned ring oscillator is provided which includes a ring oscillator circuit having a plurality of inverters connected in series in a ring and forming a ring oscillator.

According to one aspect of the invention, the output signal of the ring oscillator circuit is fed to a programmable frequency divider in which the frequency of the ring oscillator is divided down to provide a coarse frequency control for an output clock pulse.

The ring oscillator is interrupted for a predetermined period of time by having a control gate in series with the ring oscillator to inhibit operation of the oscillator ring. A control signal for the control gate is provided as the output signal of a programmable delay line, which has input terminals for receiving control signals from, for example, a microprocessor controller. The variable delay provided by the programmable delay line provides fine adjustment to the period of the output clock pulse.

A comparator circuit is provided for comparing the frequency of the output clock pulse with the frequency of a system reference pulse, for example, in the spindle index pulse of a rotating memory system comprising a magnetic disk drive.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Figure 1:
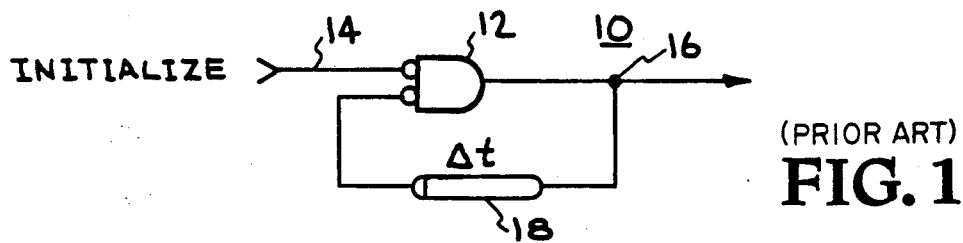
FIG. 1 is a circuit diagram of a prior art ring oscillator.

FIG. 1 shows a prior art ring oscillator circuit 10. This simple version of a ring oscillator circuit includes an inverted-input AND gate 12, or inverter, which has an initializing signal present at a signal line 14 connected to one of the input terminals. The output signal for this circuit is provided at a terminal 16. The output signal is fed back through a delay device 18 to another input terminal of the inverted-input AND gate 12, as shown.

Figure 2:
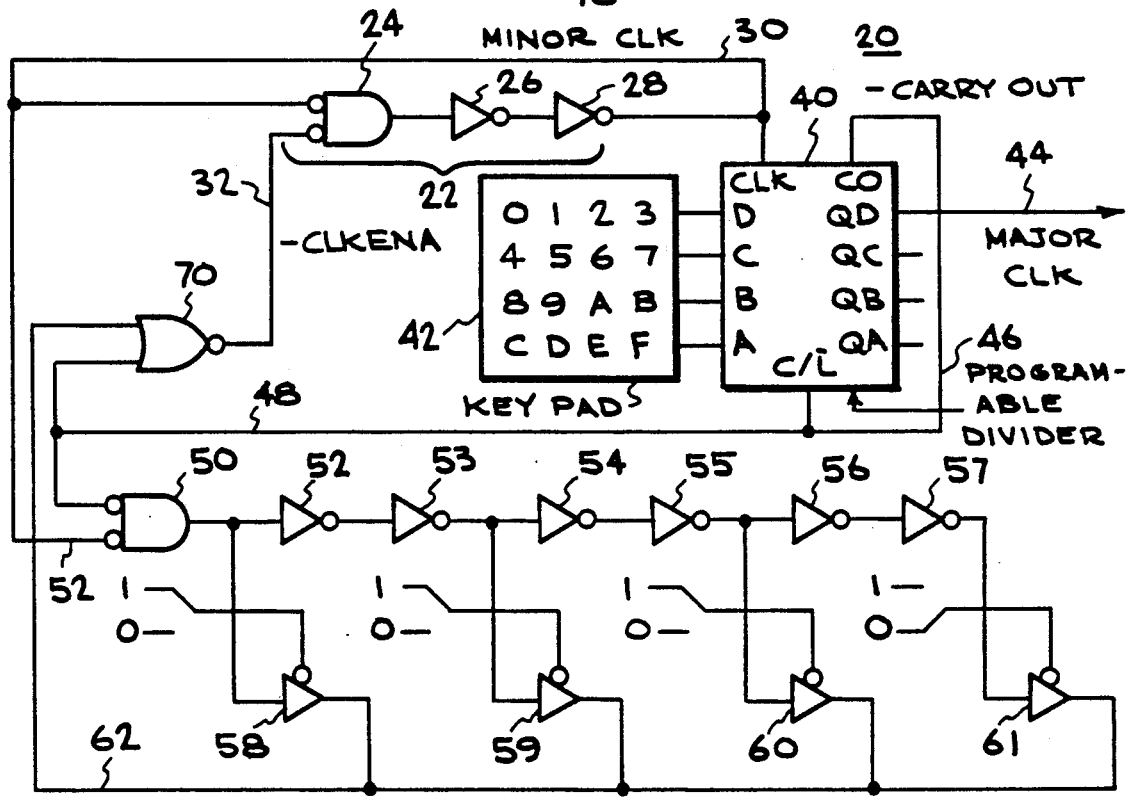
FIG. 2 is a logic circuit diagram of a tuned ring oscillator circuit according to the invention.

FIG. 2 shows a tuned ring oscillator circuit 20 according to the invention. A ring oscillator circuit 22 is formed by a 2-input inverted-input AND gate 24. The output terminal of the AND gate 24 is connected to the input terminal of an inverter 26. The output terminal of the inverter 26 is connected to the input terminal of a second inverter 28. The output terminal of the second inverter 28 is fed back on signal line 30 to one of the inverting input terminals of the inverting AND gate 24. This forms the ring oscillator circuit 22.

The inverting-input AND gate 24 functions as an inverter and also provides a means for interrupting the ring oscillator 22 for a predetermined time by inhibiting propagation of an oscillating signal through the oscillator ring 22. The AND gate 24 is disabled when a logical high signal level appears at the other input terminal to the inverting-input AND gate 24 on a signal line 32.

The output signal of the ring oscillator 22 which appears on signal line 30 is designated the Minor Clock signal. The signal appearing on the signal line 32 at the second input to the AND gate 24 is the inverted Clock Enable signal (-CLKENA). The Minor Clock signal is also connected to the clock input (CLK) of a programmable divider 40 which is programmed by, for example, a key pad 42 which provides appropriate binary input signals to the programming terminals A, B, C, D of the programmable divider 40. An inverted Carry Out CO is an active low signal. The programmable divider 40 divides down the Minor Clock output signal of the ring oscillator 22. Each period of the Minor Clock signal represents a clock increment of between 4 and 16 nanoseconds. The output of the programmable divider 40 is obtained as a Major Clock signal on a signal line 44 from the output terminal QD of the programmable divider 40. The Carry Out signal is fed back on a signal line 46 to the inverted load terminal $\overline{L}$. The Carry Out signal is also fed on a signal line 48 to one inverting input terminal of an inverting-input AND gate 50. The other input terminal of the inverting-input AND gate 50 is fed on the signal line 52 with the Minor Clock output of the ring oscillator 22. The output signal of the AND gate 50 is passed through a series of inverter pairs 52,53; 54,55; 56,57, which are connected in series as shown. These two-gate pairs form a delay line having delay increments of two gate delay times. The output signals from the AND gate 50 and each of the gate pairs is provided to the respective input terminals of respective transmission gates 58,59,60,61. These transmission gates are controlled by respective control signals at respective control terminals. These transmission gates 58,59,60,61 provide taps for the delay line formed of the inverter pairs 52-57. The output signals of the transmission gates 58,59,60,61 are tied together and connected to a signal line 62.

A NOR gate 70 has the Carry Out signal connected to one input terminal and the output signal from the transmission gates on line 62 connected to its other input terminal. The input signals to the NOR gate 70 are combined to provide the clock enable signal on signal line 32.

Figure 3A:
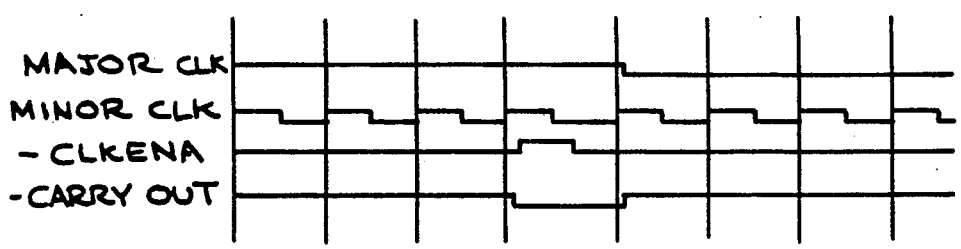
FIGS. 3A and 3B are respective sets of waveform diagrams at various terminals in the circuit of FIG. 2 for a short delay interval and for a longer delay interval.

FIG. 3A shows the signal waveforms for the Major Clock, the Minor Clock, the inverted clock enable signal, and the negative carry out signal for the circuit of FIG. 2 when a small time delay from the delay time formed by the inverters 52,57 is obtained. The period of the Major Clock signal is thereby extended for a short period of time.

Figure 3B:
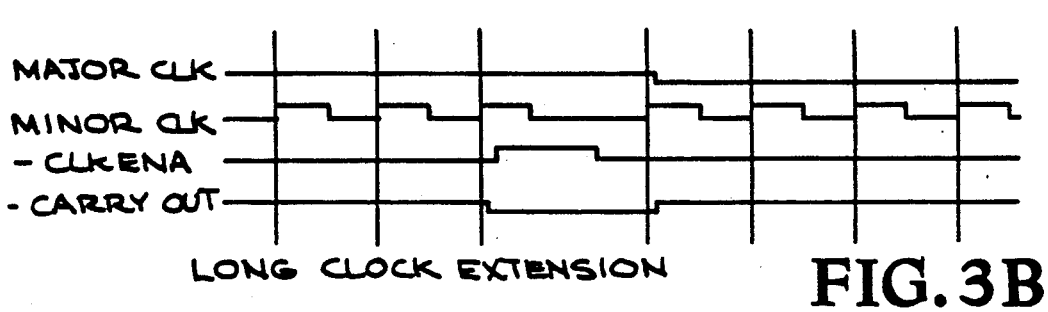

FIG. 3B shows the Major Clock, the Minor Clock, the inverted clock enable, and the inverted carry out signals obtained for a long clock delay from the delay line 52-57. The inverted enable signal is maintained at a high level in the long clock delay configuration which inhibits the ring oscillator circuit 22 for a longer period of time. This extends the period of the major clock by adding the delay line of the programmable delay line 52-57 each time that the programmable divider circuit 40 overflows. The taps on the delay line 52,57 are programmable with each tap representing one-half to two nanoseconds. In this way, the period of the major clock output signal from the programmable divider 40 on the signal line 44 is incremented in very small increments.

Figure 4A:
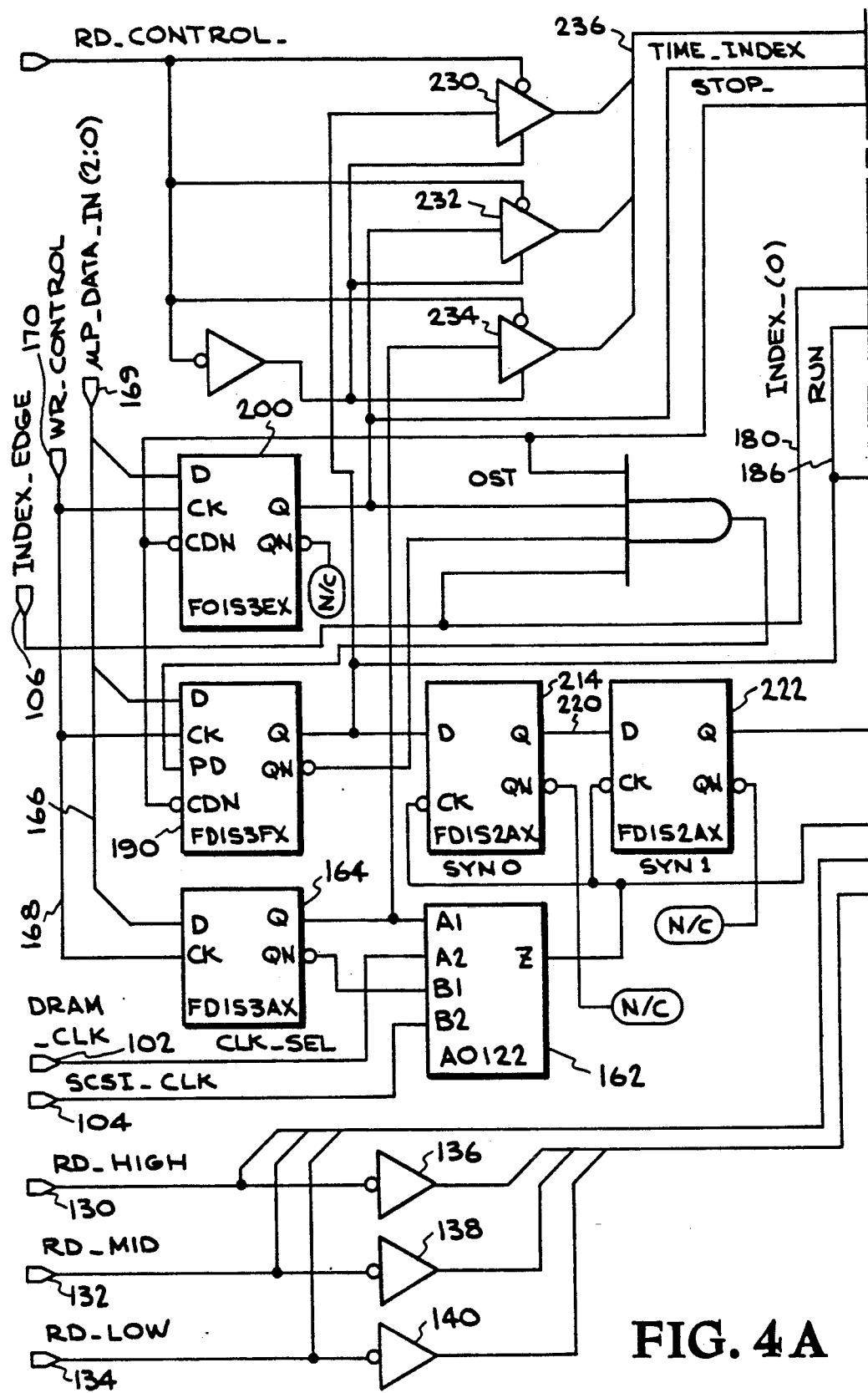
FIGS. 4A and 4B are contiguous logical circuit diagrams of a clock rate timer which performs a comparison between the frequency of the tuned ring oscillator and the frequency of a reference pulse.
Figure 4B:
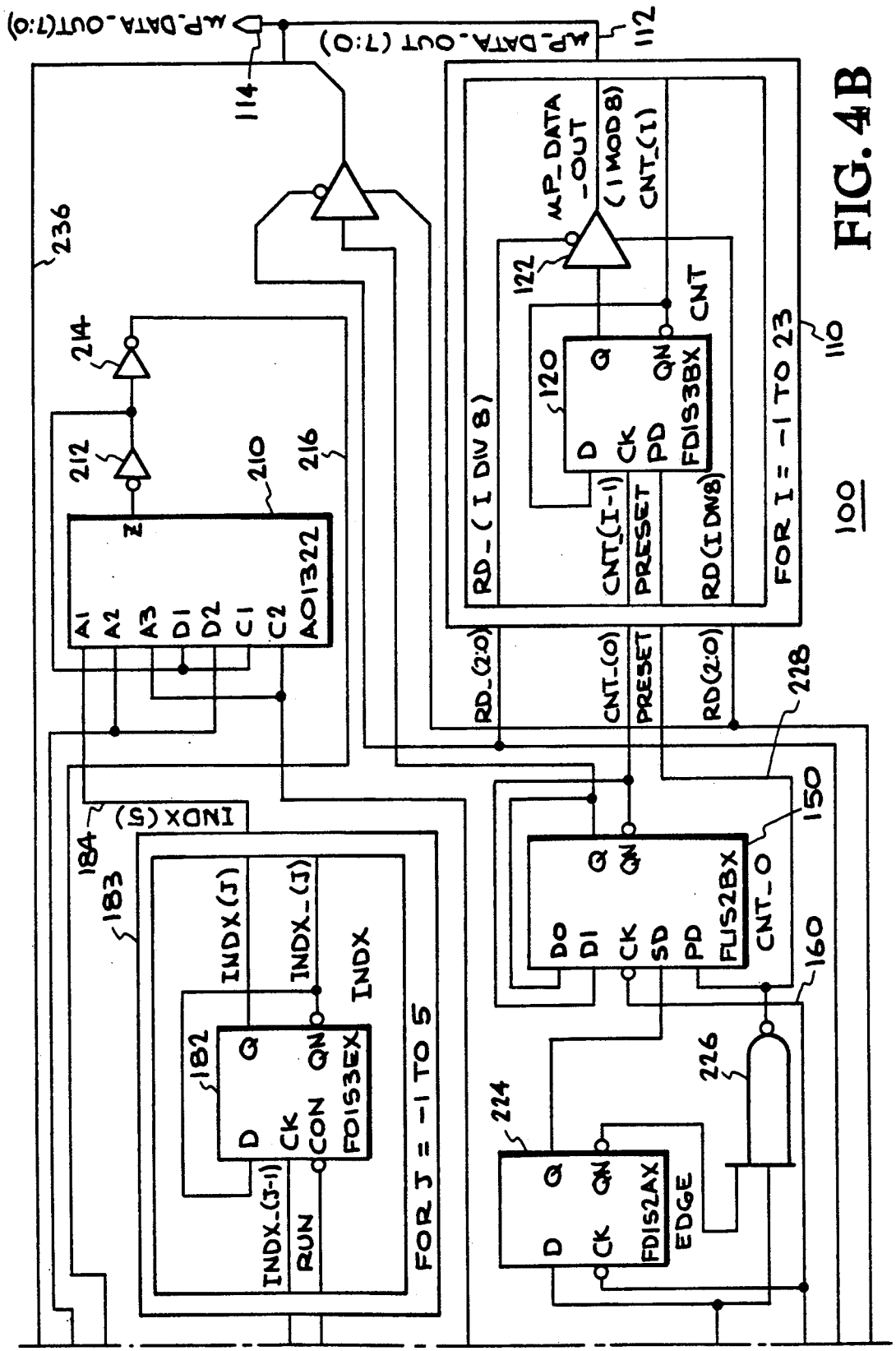

FIGS. 4A and 4B show contiguous logical circuit diagrams of a clock rate timer system 100 for comparing the frequency of an input clock signal (DRAM_Clk or SCSI_Clk) obtained from the tuned ring oscillator circuit 20 with the frequency of a reference pulse (Index_Edge). The logic circuits are formed from standard cells and building blocks provided from the AT&T 1.25 micron CMOS Library. The DRAM_Clk operates typically at frequencies in the range of 10-24 Mhz and is provided at an input terminal 102. The SCSI_Clk typically operates at 20 Mhz and is provided at an input terminal 104. The Index_Edge is provided at an input terminal 106 and is derived from the edge of the spindle index pulse for a rotating memory system comprising a magnetic disc drive system. The frequency of the Index_Edge pulse is typically 1/60th of a second.

Generally, the function of the clock rate timer system 100 shown in FIGS. 4A and 4B is to provide a time period equal to 16 periods of the Index_Edge pulse during which the time period DRAM_Clk or SCSI__Clk signals are counted to determine the frequency of the ring oscillator. These pulses are counted in a modular ripple counter provided by a series of 24 counter modules, typically indicated as 110. The outputs of the counter modules are provided as the uP_Data_Out (7:0) on signal bus 112. The respective signal lines of the bus 112 are connected to respective terminals 114. These terminals provide the information bits to a microprocessor (not shown) which compares the count of the ripple counter during the 16 periods of the Index_Edge signal. If the count from the ripple counter is not within the range acceptable to the microprocessor, the control signals from the microprocessor to the ring counter 20 are changed. The 24 bits from the ripple counter to the microprocessor are provided as three multiplexed groups of 8 bits at terminals 114. The drawing notation for FIG. 4B for a ripple counter module 110 is that each of the blocks 110 represents an I, where I=1 to 23, module. The modules are arranged and interconnected to provide a ripple counter. Each of the modules 110 include a D flip-flop 120 having its QN terminal connected to its D input terminal to function as a divide-by-two circuit. An input signal CNT_(I−1) is provided from a previous stage (I−1) as the input signal on the clock terminal CK for the Ith module. Each Q output of the D flip-flop 120 is provided through a transmission gate 122 to the output bus 112. The transmission gate 122 and similar transmission gates for the other modules of the ripple counter are controlled by the counter read signals Rd(2:0) and its inverted signal Rd_(2:0). Both the Rd_(2:0) signals and the non-inverted versions are obtained from signals presented on respective input terminals 130,132,134. These signals represent the three groups of multiplexed 8 bit blocks for the 24 bit output data word from the ripple counter. The inverted version of these three input signals are derived from Rd_ High, Rd_Mid, and Rd_Low using the respective inverters 136,138,140. This circuit configuration allows selected 8 bit blocks of information from the ripple counter to be read out onto the microprocessor data bus 112.

Note that the ripple counter contains 24 divide-by-two stages. The first stage of the ripple counter is the CNT_O stage 150 which is also a D flip-flop divider. The inverted output signal QN of the D flip-flop 150 is fed to the clock terminal of the first stage 120 of the ripple counter. The input signal to the clock CK terminal of the first stage 150 is obtained on a signal line 160 from the output terminal of a selector stage 162. The selector 162 selects either the DRAM_Clk signal or the SCSI_Clk signals as determined by a selector D flip-flop 164 having its Q and QN inputs respectively coupled to the inputs of the selector 162. The D flip-flop 164 is switched to select one of the clocks by the bit 2 line of the 3-bit data selection signal present on a signal line 166. The clock signal presented to the CK terminal of the flip-flop 164 is obtained on a signal line 168 from a write control terminal 170 Wr_Control.

Selection of the operating mode of the clock rate timer circuit 100 is obtained using a control signal obtained from the microprocessor. That signal is the UP_Data_In(2:0) signal, which is provided on three signal lines coupled to terminals 169.

A counter for counting the Index_Edge pulses, that is the Indx_(0) signal, is provided at terminal 106 to a signal line 180 and to the clock CK terminal of a first D flip-flop 182, which is the first divide-by-two stage of a five stage index counter for counting index pulses. Similar to the ripple counter 110, the five-stage index counter comprises five D flip-flop stages 183, as indicated in the drawing with appropriate connections being made for the four other stages. The output of the five-stage counter is the INDX(5) signal which is provided on a signal line 182.

The five-stage index pulse counter is activated by a Run signal provided on a signal line 186 connected to the negative clear CDN terminal of the first stage 182. The run signal is provided on signal line 186 from the Q output terminal of a run flip-flop stage 190. The run flip-flop stage 190 has a clock signal provided at its clock terminal CK from the Wr_Control terminal 170. An input signal to the D terminal of the run flip-flop 190 is obtained from the zero bit of the uP_Data_In (2:0) signals.

A Time Index flip-flop 200 is alternatively provided such that the next edge of the Index_Edge signal sets the run flip-flop 190 and starts the ripple index counter for counting the index pulses into operation. The index counter for the index pulses counts typically to 16.

When the index counter counts to 16 a signal present on signal line 184 at the output of the ripple counter is propagated through a selector 210 and two inverting stages 212,214 to a signal line 216. This signal is called the Stop signal which resets the alternate time index flip-flop 200 and the run flip-flop 190 to zero output signal levels. Note that for the circuit 210 when the time index pulse, the run pulse and the index_(5) pulse are all true, the stop signal on line 216 is also in a true state.

The run signal present on signal line 186 also is connected to the D input of a first stage Syn0 214 of a D flip-flop 214, the Q output of which is coupled through a signal line 220 to the D input of a second D flip-flop Syn 1 222. An edge D flip-flop 224 is provided also. Both the Syn 0, the Syn 1, and the edge flip-flop 224 all have their respective clock terminals CK connected to the output terminal of the selector 162 which selects either the DRAM_Clk or the SCSI_Clk clock signals. The clock signal is provided on a signal line 160 to the clock CK terminal of the first stage of CNT_0 stage of the ripple counter. The synchronized signal provided by the second stage of 222 of the synchronizer and the edge flip-flop 224 both provide respective inputs to an AND gate 226. The output of the AND gate 226 provides a preset signal on a signal line 228 to the PO terminals respectively of all of the stages of the ripple counter, as indicated, to get all stages to a 1 level.

The status of the Q output signals of the time index flip-flop 200, the run flip-flop 190, and the clock select flip-flop 164 are provided through respective transmission gates 230,232,234 on a signal bus 236 to the microprocessor data bus 112 and from thence to the respective output terminals 114 to the microprocessor.

The clock rate timer circuit shown in FIGS. 4A and 4B permits the microprocessor to control the frequency of the ring oscillator 20 as shown in FIG. 2. This is accomplished by the index ripple counter counting 16 index pulses to provide a count period for the clock pulse ripple counter. This permits the frequency of the ring oscillator 20 to be synchronized to the index pulse and tends to remove long term variations caused by temperature changes, voltage changes, and variations in semiconductor process parameters.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. A tuned ring oscillator circuit, comprising:
   a ring oscillator including a plurality of inverting stages connected in series in an oscillator ring;
   programmable frequency divider means for providing coarse control of the repetition rate of an output clock pulse, said programmable divider means having an input terminal coupled to said oscillator ring and having an output terminal at which is provided the output clock pulse;
   means for interrupting said ring oscillator for a predetermined time including control gate means for inhibiting propagation of an oscillating signal through said oscillator ring, said control gate means connected in series with said plurality of inverting stages and having a control terminal for controlling propagation of said oscillating signal;
   programmable delay line means for providing fine control of the repetition rate of the output clock pulse, said programmable delay line means including delay-time programming means for setting a delay time, said programmable delay line means having program input terminals for receiving control signals, having an input terminal coupled to the output terminal of the programmable frequency divider, and having an output terminal coupled to the control terminal of the control gate means;
   comparison means for comparing the output clock pulse frequency with the frequency of a system reference pulse and for generating control signals for the programmable delay line means to provide fine adjustment of the delay time of an output clock pulse to tune the frequency of the ring oscillator to the frequency of the system reference pulse.

2. The tuned ring oscillator circuit of claim 1 wherein the comparison means includes a control microprocessor for generating the control signals for the programmable delay line.

3. The tuned ring oscillator circuit of claim 2 wherein the comparison means includes means for measuring the frequency of the tuned ring oscillator, including a counter activated to count the number of pulses from the tuned ring oscillator for a predetermined period defined by the period of the system reference pulse wherein an information signal indicative of the number of counted pulses is provided to said control microprocessor.

4. The tuned ring oscillator circuit of claim 1 wherein the system reference pulse is an index pulse for a rotating memory system.

5. The tune ring oscillator circuit of claim 4 wherein the index pulse is a spindle index pulse.

6. A clock generation circuit for a magnetic storage disc controller, comprising:
- a ring oscillator including a plurality of inverting stages connected in series in an oscillator ring;
- programmable frequency divider means for providing coarse control of the repetition rate of an output clock pulse, said programmable divider means having an input terminal coupled to said oscillator ring and having an output terminal at which is provided the output clock pulse;
- means for interrupting said ring oscillator for a predetermined time including control gate means for inhibiting propagation of an oscillating signal through said oscillator ring, said control gate means connected in series with said plurality of inverting stages and having a control terminal for controlling propagation of said oscillating signal;
- programmable delay line means for providing fine control of the repetition rate of the output clock pulse, said programmable delay line means including delay-time programming means for setting a delay time, said programmable delay line means having program input terminals for receiving control signals, having an input terminal coupled to the output terminal of the programmable frequency divider, and having an output terminal coupled to the control terminal of the control gate means;
- comparison means for comparing the output clock pulse frequency with the frequency of a spindle index pulse of a rotating memory system comprising a magnetic disc drive and for generating control signals for the programmable delay line means to provide fine adjustment of the delay time of an output clock pulse to tune the frequency of the ring oscillator close to the frequency of the spindle index pulse.

7. The circuit of claim 6 wherein the comparison means includes a control microprocessor for generating the control signals for the programmable delay line.

8. The circuit of claim 6 wherein the comparison means includes means for measuring the frequency of the tuned ring oscillator, including a counter activated to count the number of pulses from the tuned ring oscillator for a predetermined period defined by the period of the system reference pulse wherein an information signal indicative of the number of counted pulses is provided to said control microprocessor.

* * * * *